United States Patent [19]

Smith et al.

[11] Patent Number: 4,538,169

[45] Date of Patent: Aug. 27, 1985

[54] INTEGRATED ALTERNATOR BRIDGE HEAT SINK

[75] Inventors: William R. Smith, Mesa; Theodore R. Myers, Phoenix, both of Ariz.

[73] Assignee: Motorola, Inc., Schaumburg, Ill.

[21] Appl. No.: 439,500

[22] Filed: Nov. 4, 1982

[51] Int. Cl.³ .................... H01L 23/32; H01L 23/02
[52] U.S. Cl. .................................. 357/76; 357/80; 357/81
[58] Field of Search .............................. 357/76, 80, 81

[56] References Cited

U.S. PATENT DOCUMENTS 3,697,814 10/1972 Christman et al. ............... 357/76
3,872,496 3/1975 Potter ............................. 357/81

FOREIGN PATENT DOCUMENTS 0047099 3/1982 European Pat. Off. .............. 357/81

Primary Examiner—Martin H. Edlow
Assistant Examiner—Terri M. Henn
Attorney, Agent, or Firm—William E. Koch

[57] ABSTRACT

An apparatus is provided for sinking heat from the diodes of an alternator bridge whereby the heat is transferred directly to the alternator casting. A mounting base is mounted on the alternator case in a manner to provide both thermal and electrical conductivity. A thin layer of thermally conductive, but electrically isolating, epoxy is sandwiched between a plate and a portion of the mounting base. "Negative" diodes are placed on the mounting base and "positive" diodes are placed on the plate so that electrical contact is made. Heat from the "negative" diodes is transferred through the mounting base and from the "positive" diodes through the plate and mounting base to the alternator casting, thereby reducing the thermal resistance and eliminating a need for large, "finned" heatsinks. The "negative" diodes or "positive" diodes may comprise a low voltage avalanche die, thereby providing for high energy transient suppression in the alternator. Trio diodes and a radio suppression capacitor may be mounted directly on the mounting base or plate.

10 Claims, 3 Drawing Figures

INTEGRATED ALTERNATOR BRIDGE HEAT SINK

BACKGROUND OF THE INVENTION

1. Field of the Invention

This invention relates, in general, to heat sinks and more particularly to an integrated alternator bridge heat sink that transfers heat directly to the alternator casting.

2. Background Art

Electronic devices such as diodes and transistors having substantially large currents flowing therethrough generate a large amount of heat that may cause the device to self destruct unless the heat is dissipated fairly rapidly from the device. Typically, heat sinks to which the devices are attached, are made of a light, thermally conductive metal such as aluminum and are "finned" in order to expose as much surface area as possible to the surrounding atmosphere.

A three phase alternator bridge, such as used in an automobile alternator, comprises three "negative" diodes having their anodes connected to a ground terminal and three "positive" diodes having their cathodes connected to a voltage terminal. Each of the cathodes of the "negative" diodes are connected to one of the anodes of the three "positive" diodes and to one of three stator windings of an alternator. One approach comprises connecting the three "negative" diodes to an intermediate heat sink made of a material such as copper, which in turn, is connected to a somewhat larger aluminum finned heat sink. The "positive" diodes are similarly connected to intermediate copper heat sinks and another aluminum heat sink in similar fashion. The heat from the diodes is transferred through the intermediate copper heat sink to the aluminum heat sink and by convection into the surrounding atmosphere. The bridge is attached to the interior of the alternator casting where ambient air temperatures may reach approximately 100° C.

This method just described has a large thermal resistance from the diode to the finned heat sink, thereby decreasing the efficiency of the thermal transfer. Also, a large amount of material is required for the finned heat sink, thereby increasing manufacturing costs and reducing space within the alternator casting.

Therefore, what is needed is a heat sink having a reduced thermal resistance between the heat generating device and the apparatus for sinking the heat, and reduced size for lowering cost and space requirements.

SUMMARY OF THE INVENTION

Accordingly, it is an object of the present invention to provide an improved integrated alternator bridge heat sink.

Another object of the present invention is to provide an integrated alternator bridge heat sink that has a reduced thermal resistance between the diodes and the heat sink.

Yet another object of the present invention is to provide an integrated alternator bridge heat sink requiring less material than previously required.

Still another object of the present invention is to provide an integrated alternator bridge heat sink mounted directly to the casting, said casting sinking heat from the electronic devices of the bridge.

A further object of the present invention is to provide a single integrated alternator bridge heat sink having both "negative" and "positive" diodes mounted thereon.

Yet a further object of the present invention is to provide an integrated alternator bridge heat sink having trio diodes and a radio frequency interference suppression capacitor mounted thereon for reducing cost and improving performance.

In carrying out the above and other objects of the invention in one form, there is provided an improved integrated alternator bridge heat sink for sinking heat from the diodes of an alternator bridge circuit whereby the heat is transferred directly to the alternator casting. A mounting base is mounted on the alternator casting in a manner to provide both good thermal and electrical conductivity. A thin layer of thermally conductive, but electrically nonconductive, epoxy is sandwiched between a plate and a portion of the mounting base. Diodes are placed on both the mounting base and plate so that electrical contact is made between one side of the diodes and the mounting base and plate. Heat is transferred through both the plate and mounting base to the alternator casting, thereby eliminating a need for large, "finned" heat sinks, and reducing the thermal path in which the dissipating heat needs to travel.

The above and other objects, features, and advantages of the present invention will be better understood from the following detailed description taken in conjunction with the accompanying drawings.

DETAILED DESCRIPTION OF THE INVENTION

Figure 1:
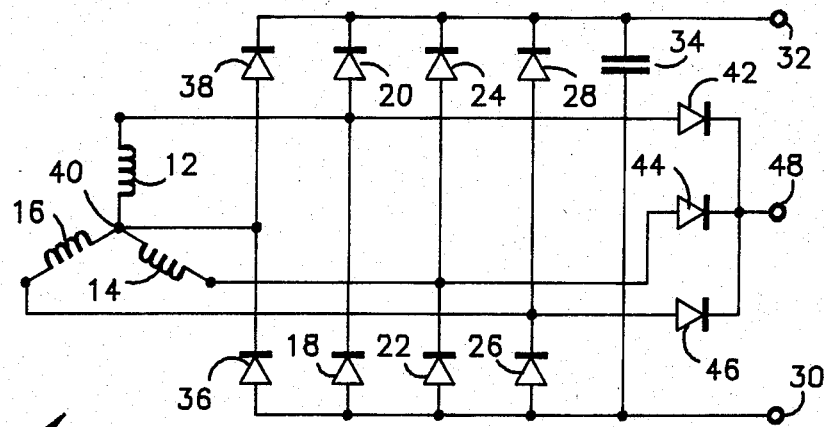
FIG. 1 is a schematic of a typical alternator bridge circuit.

Referring to FIG. 1, a circuit 10 of a typical alternator bridge is connected to alternator stator windings 12, 14, 16. The circuit 10 may be used with any type of alternator, but will function especially well with an alternator that provides a current for automobiles. An automobile alternator typically is housed in an aluminum casting adjacent to the engine.

The alternator stator windings 12, 14, 16 each have one end interconnected to each other at node 40. The other end of stator winding 12 is connected to the cathode of diode 18 and anode of diode 20. The other end of stator winding 14 is connected to the cathode of diode 22 and the anode of diode 24. The other end of stator winding 16 is connected to the cathode of diode 26 and the anode of diode 28. Diodes 18, 22, 26 have their anodes connected to negative terminal 30 and are usually referenced as "negative" diodes. Diodes 20, 24, 28 have their cathodes connected to positive terminal 32 and are usually referenced to as "positive" diodes. Terminal 30 will be at a lower voltage than terminal 32 and is typically connected to the alternator casting which is at ground.

More advanced alternator bridges have a capacitor 34 coupled between terminals 30, 32 for suppression of electrical noise, i.e., for an automobile radio. An additional set of diodes 36, 38 having their cathode and anode, respectively, connected to a neutral point or node 40 of alternator stator windings 12, 14, 16 and their anode and cathode, respectively, connected to terminals 30 and 32, may be included for additional current output at high RPMs.

Trio diodes 42, 44, 46 have their anodes connected to the ends of stator windings 12, 14, 16 respectively, and their cathodes connected to terminal 48. Trio diodes 42, 44, 46 provide the field excitation for the rotor through the voltage regulator. Terminal 48 may also be connected to a light on the automobile driver's panel for giving an indication of proper or improper output from the alternator.

Figure 2:
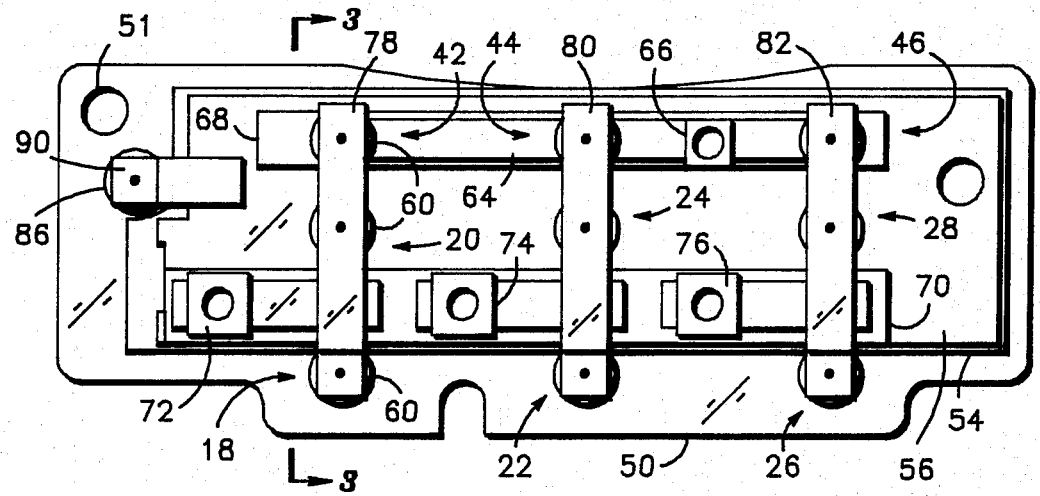
FIG. 2 is a top view of an alternator bridge circuit apparatus in accordance with the present invention.
Figure 3:
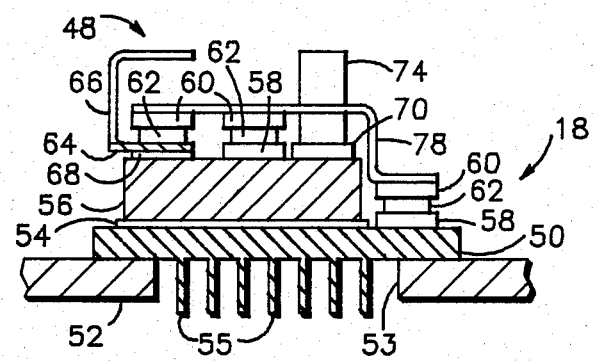
FIG. 3 is a cross section taken along the line 3—3 of FIG. 2.

Referring now to FIGS. 2 and 3, the heat sink construction of the present invention utilizing the circuit 10 is shown. A mounting base 50 is mounted on alternator casting or frame 52 by, for example, bolting through holes 51. The casting typically forms an enclosed area with the mounting base 50 located either on the inside or outside of the enclosed area of casting 52. Fins 55 are integrally connected to mounting base 50 and extend through an aperture 53 in alternator casting 52.

A layer of thermally conductive epoxy 54 overlies a portion of mounting base 50. Plate 56 is positioned on top of epoxy 54 so as to be electrically nonconductive with mounting base 50.

"Negative" diodes 18, 22, 26, "positive" diodes 20, 24, 28, and trio diodes 42, 44, 46 are all shown as button diodes, however, any type of diode may be used. Button diodes are well known to those skilled in the art. Diodes 18, 20, 22, 24, 26, 28 all comprise a lower metal disk 58 and an upper metal disc 60. Sandwiched between the lower and upper metal disks 58, 60 is a thin layer of semiconductor glass passivated die 62 which functions as a diode. The lower and upper metal plates 58, 60 are soldered to the die 62 and provide for good electrical contact with the die 62. The lower metal plate 58 of negative diodes 18, 22, 26 are also soldered to the mounting plate 50. The lower disc 58 of the positive diodes 20, 24, 28 is soldered to plate 56. The glass passivated die of either "negative" diodes 18, 22, 26 or "positive" diodes 20, 24, 28, or both, may comprise a low voltage avalanche die, thereby providing for high energy transient suppression in the alternator.

Trio diodes 42, 44, 46 are similarly constructed having an upper disk 60 and die 62. However, the lower disk 58 is replaced by a metal strip 64 having arm 66 which serves as the terminal 48 of circuit 10. Thermally conductive epoxy layer 68 is mounted between metal strip 64 and plate 56. Alternatively, trio diodes 42, 44, 46 and layer 68 may be mounted on mounting base 50, thereby eliminating the thermal resistance of plate 56. Furthermore, the disks of diodes 18, 20, 22, 24, 26, 28, 42, 44, 46 may be eliminated by using a material such as copper clad aluminum for mounting base 50 and plate 56.

Epoxy layer 70 is mounted between plate 56 and bars 72, 74, 76 which serve as terminals which are connected to the ends of stator windings 12, 14, 16 of circuit 10. Bar 72 is electrically connected, i.e. by soldering, to strip 78 which is connected to upper disk 60 of diodes 18, 20, 42. Bar 74 is connected to strip 80 which is connected to upper disk 60 of diodes 22, 24, 44. Bar 76 is connected to strip 82 which is connected to upper disk 60 of diode 26, 28, 46.

Capacitor 34 comprises a lower member (not shown) and an upper member 86 separated by a dielectric layer (not shown). The lower member is connected to mounting base 50 in a manner for providing electrical contact. Bar 90 is connected between upper member 86 and plate 56 and provides for electrical contact therebetween. Alternatively, capacitor 34 may be placed on plate 56 with bar 90 providing electrical contact from the upper member 86 to mounting base 50. Another alternative would be to connect upper member 86 and the lower member to plate 56 and mounting base 50, respectively, with an electrically conductive epoxy or solder, thereby eliminating bar 90.

It may be seen that heat generated by die 62 of negative diodes 18, 22, 26 will transfer through disk 58 and mounting base 50 to casting 52. Heat generated by die 62 of positive diodes 20, 24, 28 will transfer through disk 58, plate 56, epoxy layer 54, and mounting base 50 to casting 52 while epoxy 54 provides for electrical isolation. Heat generated by die 62 of trio diodes 42, 44, 46 will transfer through strip 64, epoxy layer 68, plate 56, epoxy layer 54, and mounting base 50 to casting 52, while epoxy layer 68 provides for electrical isolation.

The entire heat sink described herein may be overmolded for environmental protection, except for external connections and the surface of mounting base 50 which is in contact with alternating casting 52, with a thermal set or thermoplastic material such as epoxy or phenolic. Further cooling, and a reduction in the size of mounting base 50 and plate 56, may be gained by strips 78, 80, 82 comprising one or more "fins" (not shown) extending through the molding into the airflow. Another embodiment may comprise an opening 53 in alternator casting 52 adjacent a portion of mounting base 50 wherein "fins" 55 integrally formed with mounting base 50 extend through the opening 53 into the airflow. Cooling would then be accomplished by convection around the "fins" 55 as well as through the alternator casting 52.

By now it should be appreciated that there has been provided an improved integrated alternator bridge heat sink. This apparatus provides for better utilization of material by eliminating redundant heat sinks and packaging resulting in a more compact unit. Furthermore, the sandwich construction of the apparatus is more rigid than previously known alternator heat sinks and has a lower thermal resistance. The compact arrangement allows both positive and negative diodes to use the same heat sink.

We claim:

1. An apparatus for transferring heat from one or more first electronic devices and one or more second electronic devices to a frame, comprising:

a mounting base of heat and electrical conducting material thermally and electrically connected to said frame, said first electronic device connected to a first portion of said mounting base, said mounting base for coupling to receive a first voltage;

a first layer of thermally conductive epoxy adjacent a second portion of said mounting base, said layer being electrically nonconductive; and a plate of thermal and electrical conducting material adjacent said layer, a first portion of said plate thermally and electrically connected to said second electronic device and for coupling to receive a second voltage, wherein heat generated by said first electronic device may transfer through said mounting base to said frame, heat generated by said second electronic device may transfer through said plate, said material, and said mounting base to said frame.

2. The apparatus of claim 1 further comprising:

a second layer of thermal conductive epoxy adjacent a second portion of said plate, said layer being electrically nonconductive; and one or more third electronic devices thermally and electrically connected to said second layer.

3. The apparatus according to claim 1 further comprising a capacitor having a first electrode and a second electrode, said first electrode being adjacent said mounting base so as to provide electrical contact therebetween, said second electrode being electrically connected to said plate.

4. An alternator bridge including three negative diodes and three positive diodes, each having an anode and a cathode, further including an apparatus for sinking heat from said negative diodes and said positive diodes to a casting enclosing an alternator having three stator windings, said apparatus comprising:

a mounting base of thermal and electrical conductive material attached to said casting in a manner for providing thermal and electrical conductivity and having said negative diodes electrically and thermally connected thereto;

a first layer attached to said mounting base next to said negative diodes, said layer being thermally conductive and electrically nonconductive; and a plate of thermal and electrical conductive material attached to said first layer in a manner for providing thermal conductivity, a first portion of said plate electrically and thermally connected to said positive diodes, said plate for coupling to receive a first voltage, and said mounting base for coupling to receive a second voltage.

5. The alternator bridge according to claim 4 wherein said apparatus further comprises:

a second layer of thermal conductive epoxy adjacent a second portion of said plate, said layer being electrically nonconductive; and at least three "trio" diodes thermally and electrically connected to said second layer.

6. The alternator bridge according to claim 4 wherein said apparatus further comprises a capacitor having a first electrode and a second electrode, said first electrode being adjacent said mounting base so as to provide electrical contact therebetween, said second electrode being electrically connected to said plate.

7. The alternator bridge according to claim 4 wherein said apparatus further comprises terminals connected to each of said negative diodes and said positive diodes for direct connection to a stator of an alternator.

8. The alternator bridge according to claim 4 further comprising one or more fins integrally mounted on said mounting base and extending into an airflow.

9. The alternator bridge according to claim 8 wherein said fins extend through an aperture in said casting into said airflow.

10. The alternator bridge according to claim 4 wherein at least three of said negative diodes and said positive diodes comprise a low voltage avalanche die.

* * * * *